United States Patent
Mao et al.

(10) Patent No.: US 12,149,846 B2
(45) Date of Patent: Nov. 19, 2024

(54) TIME DELAY INTEGRATION (TDI)-BASED IMAGE SENSOR AND IMAGING METHOD THEREOF

(71) Applicant: NANJING UNIVERSITY, Jiangsu (CN)

(72) Inventors: Cheng Mao, Jiangsu (CN); Xiangshun Kong, Jiangsu (CN); Feng Yan, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 107 days.

(21) Appl. No.: 18/026,547

(22) PCT Filed: Sep. 15, 2021

(86) PCT No.: PCT/CN2021/118533
§ 371 (c)(1),
(2) Date: Mar. 15, 2023

(87) PCT Pub. No.: WO2022/057831
PCT Pub. Date: Mar. 24, 2022

(65) Prior Publication Data
US 2023/0345148 A1    Oct. 26, 2023

(30) Foreign Application Priority Data
Sep. 16, 2020  (CN) .......................... 202010971985.8

(51) Int. Cl.
*H04N 25/711*  (2023.01)
*H04N 25/71*  (2023.01)
(Continued)

(52) U.S. Cl.
CPC .......... *H04N 25/711* (2023.01); *H04N 25/74* (2023.01); *H04N 25/745* (2023.01); *H04N 25/75* (2023.01); *H04N 25/773* (2023.01)

(58) Field of Classification Search
None
See application file for complete search history.

(56) References Cited

U.S. PATENT DOCUMENTS 6,853,698 B1   2/2005 Nguyen
2004/0212708 A1  10/2004 Spartiotis et al.
(Continued)

FOREIGN PATENT DOCUMENTS

CN   112019777 A   12/2020
JP   2014093616 A   5/2014
(Continued)

OTHER PUBLICATIONS

Kong, Xiangshun et al., SPAD Sensors with 256 X2 Linear Array for Time Delay Integration Demonstration 2018 IEEE Sensors, Oct. 31, 2018, Section I -IV, Figure 1-3 (4 pgs).
(Continued)

*Primary Examiner* — Mark T Monk
(74) *Attorney, Agent, or Firm* — VOLPE KOENIG

(57) ABSTRACT

Disclosed are a time delay integration (TDI)-based image sensor and an imaging method thereof. The TDI-based image sensor includes: a multi-stage linear array including a plurality of single-stage linear arrays arranged along a scanning direction of the image sensor. Each single-stage linear array includes a plurality of pixels arranged along the linear array direction. Each single-stage linear array enters a count mode in response to a first control signal, and enters a transfer mode in response to a second control signal. In the count mode, each single-stage linear array counts optical signals incident on the pixels and obtains a count value, and in the transfer mode, each single-stage linear array stops counting, except for the last single-stage linear array, other single-stage linear arrays each output the obtained current count value to the next single-stage linear array, and the last
(Continued)

S910

Scanning an object to be imaged by using a plurality of single-stage linear arrays arranged along a scanning direction of an image sensor, where each single-stage linear array comprises a plurality of pixels arranged along a linear array direction; where, in response to a first control signal, each single-stage linear array is made to enter a counting mode, and in response to a second control signal, each single-stage linear array is made to enter a transfer mode, where in the counting mode, each stage of single-stage linear array is used to count optical signals incident on pixels and obtain a count value, while in the transfer mode, each stage of single-stage linear array is stopped from counting, and a current count value obtained by any other stage of single-stage linear array except a last stage of single-stage linear array is transferred to a next stage of single-stage linear array, and a current count value obtained by the last stage of single-stage linear array is output single-stage linear array outputs the obtained current count value.

20 Claims, 6 Drawing Sheets

(51) Int. Cl.
*H04N 25/74* (2023.01)
*H04N 25/75* (2023.01)
*H04N 25/773* (2023.01)

(56) References Cited

U.S. PATENT DOCUMENTS

| | | |
|---|---|---|
| 2005/0151863 A1 | 7/2005 | Johannesson et al. |
| 2012/0087472 A1 | 4/2012 | Nyholm |
| 2020/0045251 A1 | 2/2020 | Koizumi et al. |

FOREIGN PATENT DOCUMENTS

| | | |
|---|---|---|
| JP | 2018061079 A | 4/2018 |
| JP | 2019193043 A | 10/2019 |

OTHER PUBLICATIONS

FLIP-flop Conversions Administrator (Jun. 6, 2015). ElectronicsHub. (16 pgs.) Retrieved from https://www.electronicshub.org/flip-flop-conversions/.

S910

Scanning an object to be imaged by using a plurality of single-stage linear arrays arranged along a scanning direction of an image sensor, where each single-stage linear array comprises a plurality of pixels arranged along a linear array direction; where, in response to a first control signal, each single-stage linear array is made to enter a counting mode, and in response to a second control signal, each single-stage linear array is made to enter a transfer mode, where in the counting mode, each stage of single-stage linear array is used to count optical signals incident on pixels and obtain a count value, while in the transfer mode, each stage of single-stage linear array is stopped from counting, and a current count value obtained by any other stage of single-stage linear array except a last stage of single-stage linear array is transferred to a next stage of single-stage linear array, and a current count value obtained by the last stage of single-stage linear array is output

FIG. 9

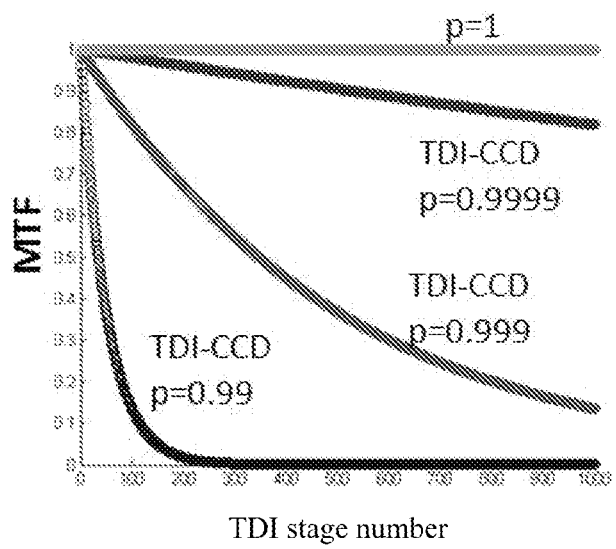

FIG. 10

TIME DELAY INTEGRATION (TDI)-BASED IMAGE SENSOR AND IMAGING METHOD THEREOF

CROSS-REFERENCE TO RELATED APPLICATION

The present application claims priority to China Patent Application No. 202010971985.8 filed on Sep. 16, 2020, contents of which are hereby incorporated by reference in its entirety as a part of this application.

TECHNICAL FIELD

The present disclosure relates to a Time Delay Integration (TDI)-based image sensor and an imaging method thereof, and in particular, to an image sensor utilizing a Single Photon Avalanche Diode (SPAD) to realize time delay integration and a corresponding imaging method.

BACKGROUND

Time delay integration is an imaging method to improve signal-to-noise ratio of images in a high-speed scanning imaging mode, which is usually used in Charge Coupled Device (CCD) technology, that is, TDI-CCD image sensors. FIG. 1 shows a schematic diagram of a TDI image sensor used for imaging. In a linear array scanning system, an increasing direction of stage number of the TDI image sensor is a scanning direction of a camera. Multiple exposure imaging of a same scene through different stages of linear arrays can prolong an equivalent integration time of imaging and help improve the signal-to-noise ratio. There is a positive correlation between the signal-to-noise ratio and the number of stages of the TDI sensor. The more stages of the TDI image sensor, the higher the signal-to-noise ratio of images that can be achieved under a same imaging condition. In general, TDI technology is widely used in linear array scanning applications, such as industrial pipeline scanning, low-orbit satellite scanning and so on, especially in low illumination and high-speed imaging systems, which can obtain images with high signal-to-noise ratio in a relatively short time.

However, TDI-CCD image sensor has some disadvantages, such as high manufacturing cost, high working voltage and the like. Recently, the industry has proposed a TDI image sensor based on CMOS technology. TDI-CMOS technology is compatible with CMOS technology and has low cost, but its transfer mode is usually analog domain accumulation or digital domain accumulation after row and column readout, which is easy to introduce noise and requires complex control timing. In general, there is a certain gap between TDI-CMOS image sensor and TDI-CCD in both noise level and imaging quality.

SUMMARY

To this end, the present disclosure provides an image sensor based on time delay integration and an imaging method thereof, and in particular, to an image sensor utilizing a single photon avalanche diode to realize time delay integration and a corresponding imaging method, which are particularly suitable for low illumination and high-speed scanning imaging systems.

According to an aspect of the present disclosure, a Time Delay Integration (TDI)-based image sensor is proposed, comprising: a multi-stage linear array, including a plurality of single-stage linear arrays arranged along a scanning direction of the image sensor, wherein the scanning direction of the image sensor is a stage number direction, wherein each single-stage linear array includes a plurality of pixels arranged along a linear array direction, and the linear array direction is perpendicular to the stage number direction, wherein, each stage of single-stage linear array enters a counting mode in response to a first control signal and enters a transfer mode in response to a second control signal, wherein in the counting mode, each stage of single-stage linear array counts optical signals incident on the pixels and obtains a count value, while in the transfer mode, each stage of single-stage linear array stops counting, any other stage of single-stage linear array except a last stage of single-stage linear array output an obtained current count value to a next stage of single-stage linear array, and the last stage of single-stage linear array output an obtained current count value.

According to an example of the present disclosure, wherein the optical signals are photons, and each pixel comprises: a pixel unit that detects the photons and outputs pulse signals, wherein a number of the pulse signals is related to a number of the photons; a counter that receives the pulse signals output by the pixel unit, counts the number of the pulse signals in response to the first control signal and obtains the count value, and stops counting in response to the second control signal and outputs the obtained current count value.

According to an example of the present disclosure, wherein, the pixel unit includes a Single Photon Avalanche Diode (SPAD), wherein the SPAD is connected to a reverse bias voltage so that the SPAD works in Geiger mode.

According to an example of the present disclosure, wherein each pixel further comprises: a quenching circuit connected with the SPAD, that reduces the reverse bias voltage of the SPAD to quench avalanche and outputs a pulse signal after the SPAD receives avalanche breakdown of a single photon.

According to an example of the present disclosure, wherein each pixel further comprises: a pulse shaping circuit connected with the quenching circuit, that shapes the pulse signal output by the quenching circuit and outputs a digital pulse signal to the counter.

According to an example of the present disclosure, the image sensor further comprises: a latch circuit that latches the count value output by the last stage of single-stage linear array in response to the second control signal; and an address selection circuit that reads the count value latched by the latch circuit for a post-processing circuit to generate image information based on the count value.

According to an example of the present disclosure, the image sensor further comprises: a timing control circuit that generates the first control signal and the second control signal and provides them to each stage of the multi-stage linear array.

According to an example of the present disclosure, wherein in each single-stage linear array, pixel units and counters respectively form a pixel unit linear array and a counter linear array along the array direction.

According to an example of the present disclosure, wherein pixel unit linear arrays and counter linear arrays are alternately arranged in the multi-stage linear array and are arranged on a same layer; or the pixel unit linear arrays and the counter linear arrays respectively form a pixel unit array and a counter array, and the pixel unit array and the counter array are arranged on a same layer, pixel units in the pixel unit array being electrically connected with corresponding counters in the counter array.

According to an example of the present disclosure, wherein pixel unit linear arrays and counter linear arrays respectively form a pixel unit array and a counter array, and the pixel unit array and the counter array are arranged on different layers.

According to an example of the present disclosure, wherein the pixel unit array and the counter array are arranged on different layers based on a 3D stack process, and pixel units in the pixel unit array are electrically connected with corresponding counters in the counter array.

According to an example of the present disclosure, wherein at least one of the quenching circuit and the pulse shaping circuit is integrated in the pixel unit.

According to an example of the present disclosure, wherein the counter comprises a multi-stage cascaded trigger unit, wherein each stage of trigger unit of the multi-stage cascaded trigger unit comprises a trigger, a first data selector and a second data selector connected with the trigger, wherein each stage of trigger comprises: a data input end connected to an output end of the first data selector; a clock input end connected to an output end of the second data selector; a first output end for outputting counting pulses; and a second output end connected to a first input end of the first data selector, wherein, a first input end of a second data selector in any other stage of trigger unit except a first stage of trigger unit is connected to a second output end of a trigger in a previous stage of trigger unit, and a first input end of a second data selector in the first stage of trigger unit is connected to an output end of the pulse shaping circuit; a second input end of a second data selector in each stage of trigger unit receives the second control signal.

According to an example of the present disclosure, wherein a second input end of a first data selector of a pixel in any other stage of single-stage linear array except the first stage of single-stage linear array is connected to a first output end of a corresponding trigger of a previous stage of single-stage linear array; a second input end of a first data selector of a pixel in of the first-stage of single-stage linear array receives a first level signal; and a first output end of a trigger of a pixel in the last stage of single-stage linear array is connected to the latch circuit.

According to an example of the present disclosure, wherein control ends of the first data selector and the second data selector in the trigger unit receive the first control signal.

According to an example of the present disclosure, wherein the trigger is a D trigger.

According to an example of the present disclosure, wherein the trigger is one of a JK trigger, an RS trigger and a T trigger, and the trigger unit further comprises a logic gate circuit connected with the trigger so as to realize function of a D trigger by using the JK trigger, the RS trigger or the T trigger.

According to another aspect of the present disclosure, an imaging method based on Time Delay Integration (TDI) is provided, comprising: scanning an object to be imaged by using a plurality of single-stage linear arrays arranged along a scanning direction of an image sensor, wherein the scanning direction of the image sensor is a stage number direction; each single-stage linear array comprises a plurality of pixels arranged along a linear array direction, and the linear array direction is perpendicular to the stage number direction; wherein, in response to a first control signal, each single-stage linear array is made to enter a counting mode, and in response to a second control signal, each single-stage linear array is made to enter a transfer mode, wherein in the counting mode, each stage of single-stage linear array is used to count optical signals incident on pixels and obtain a count value, while in the transfer mode, each stage of single-stage linear array is stopped from counting, and a current count value obtained by any other stage of single-stage linear array except a last stage of single-stage linear array is transferred to a next stage of single-stage linear array, and a current count value obtained by the last stage of single-stage linear array is output.

According to an example of the present disclosure, wherein the optical signals are photons, and the imaging method further comprises: detecting the photons and outputting pulse signals by using a pixel unit, wherein a number of the pulse signals is related to a number of the photons; and receiving, by a counter, the pulse signals output by the pixel unit, counting the number of the pulse signals in response to the first control signal and obtaining the count value, and stopping counting in response to the second control signal and outputting the obtained current count value.

According to an example of the present disclosure, wherein detecting the photons and outputting the pulse signals by using a Single Photon Avalanche Diode (SPAD); wherein the SPAD is connected to a reverse bias voltage so that the SPAD works in Geiger mode.

According to an example of the present disclosure, the imaging method further comprises: latching the count value output by the last stage of single-stage linear array in response to the second control signal; and reading the latched count value to generate image information based on the count value.

The time-delay-integration SPAD image sensor proposed in this disclosure has the advantages of low readout noise, low transfer noise, less restriction of TDI stage number by MTF, low cost and the like compared with the existing TDI-CCD image sensor technology, because both its imaging process and transfer process are purely digital processes with low noise introduction level and little influence on MTF by the number of transfers.

BRIEF DESCRIPTION OF DRAWINGS

FIG. 9 is a method for imaging by a Time Delay Integration (TDI)-based image sensor according to a principle of the present disclosure; and FIG. 10 shows a comparison of a relationship between transfer efficiency and TDI stage number when imaging by the image sensor according to a principle of the present disclosure and an existing TDI-CCD.

DETAILED DESCRIPTION

The present disclosure will be described below in detail in conjunction with the accompanying drawings and specific embodiments. The described specific embodiments are only used to explain principles of the present disclosure and are not intended to limit the scope of the technical scheme of the disclosure. It should be understood that although terms such as "first" and "second" may be used herein to describe various elements, these elements should not be limited by these terms. These terms are only used to distinguish one element from another.

Figure 1:
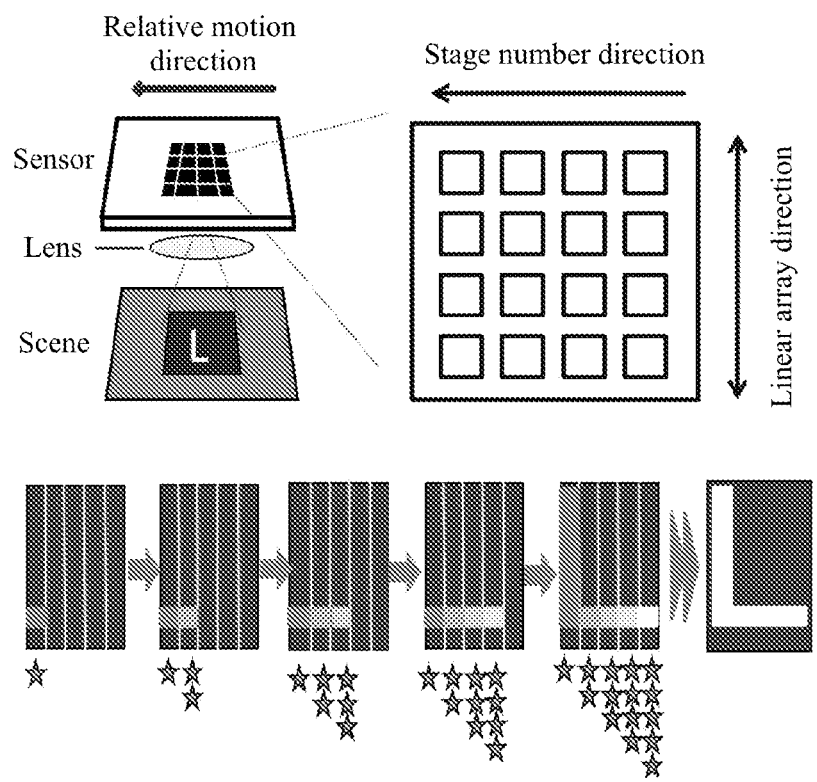
FIG. 1 is a schematic diagram of imaging using a time-delay-integration image sensor based on a linear scanning system.

FIG. 1 is a schematic diagram of imaging using a time-delay-integration image sensor based on a linear scanning system. As shown in FIG. 1, when imaging based on the linear scanning system, the time-delay-integration image sensor is composed of linear arrays, in which a stage number direction is a relative motion direction, that is, a scanning direction of a camera; the direction perpendicular to the stage number direction is a linear array direction, and pixels arranged in this direction together form a single-stage linear array. In a scanning process, single-stage linear arrays of different stages successively expose and image a same scene, and transmit obtained photoelectric signals to later stages, and the signals transmitted to the later stages are superimposed with photoelectric signals obtained by exposure of the next stages and then transmitted to later stages again. Therefore, multiple exposure imaging and superimposition of the same scene through different stages of single-stage linear arrays actually prolongs an equivalent integration time of imaging and is conducive to improving the signal-to-noise ratio. There is a positive correlation between the signal-to-noise ratio and the number of stages of linear arrays. The more stages of linear arrays a TDI sensor includes, the higher the signal-to-noise ratio of a corresponding image obtained under a same imaging condition.

As mentioned above, there are two types of TDI image sensors at present, one is TDI-CCD image sensor, which has some disadvantages such as high manufacturing cost and high working voltage; the other is TDI image sensor based on CMOS technology. However, a transfer mode of TDI-CMOS image sensor between different stages of linear arrays is usually analog domain accumulation or digital domain accumulation after row and column readout, which is easy to introduce noise and requires complex control timing, resulting in a certain gap between TDI-CMOS image sensor and TDI-CCD in noise level, imaging quality and the like.

This disclosure proposes to use a transferable counter to realize the function of transferring digital signals output by a current stage to a later stage, with an accumulation function realized by counting using a counter. Because the image sensor based on a transferable counter between single-stage linear arrays of various stages proposed in this disclosure does not have an analog-to-digital conversion process, but adopts an all-digital circuit, it has the advantages of low read-out noise, low transfer noise, less restriction of TDI stage number by Modulation Transfer Function (MTF), low cost and the like.

Figure 2:
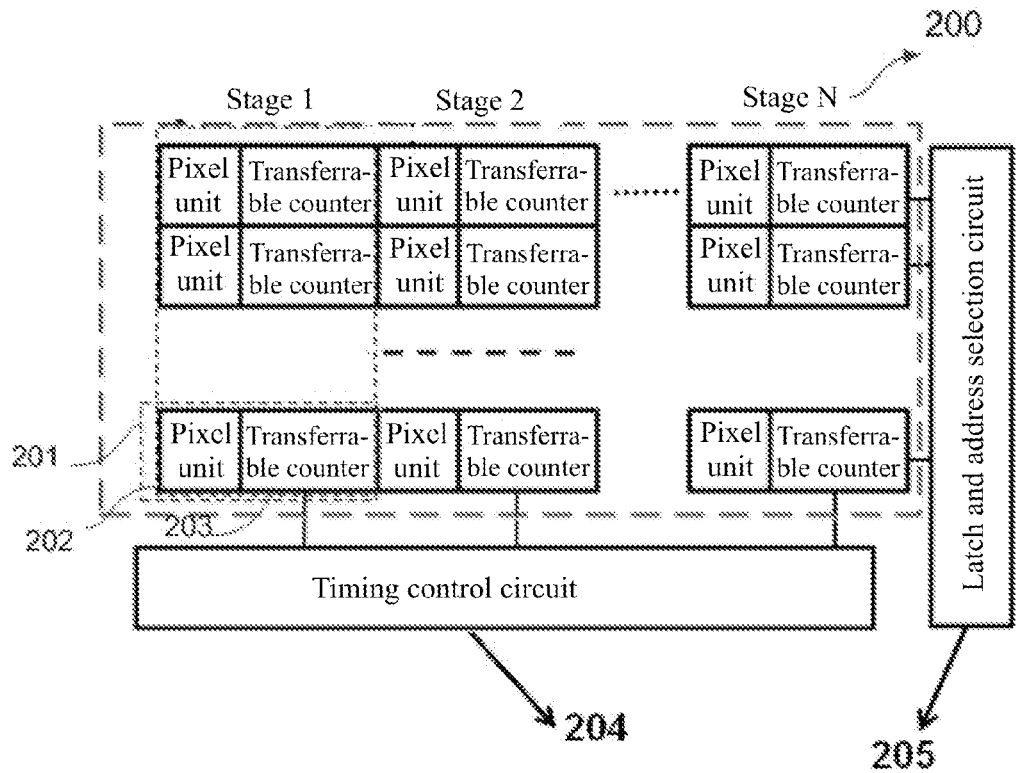
FIG. 2 is a schematic diagram of a linear array arrangement scheme of the time-delay-integration image sensor proposed according to a principle of the present disclosure.

FIG. 2 is a schematic diagram of a linear array arrangement scheme of a time-delay-integration image sensor proposed according to a principle of the present disclosure. As shown in FIG. 2, the time-delay-integration image sensor includes a multi-stage single-line linear array 200 and related functional circuits, such as a timing control circuit 204, a latch, an address selection circuit 205 and the like. The multi-stage linear array 200 includes a plurality of single-stage linear arrays arranged along a scanning direction of the image sensor, such as a first stage of single-stage linear array, a second stage of single-stage linear array ..., a Nth stage of single-stage linear array, and the scanning direction of the image sensor is a stage number direction of the multi-stage single-line linear array. Each stage of single-stage linear array includes a plurality of pixels 201 arranged along a linear array direction perpendicular to the stage number direction, and each pixel 201 includes a pixel unit 202 and a corresponding transferable counter 203.

Each stage of single-stage linear array enters a counting mode in response to a first control signal, and enters a transfer mode in response to a second control signal, where in the counting mode, each stage of single-stage linear array counts optical signals incident on the pixels and obtains a count value, while in the transfer mode, each stage of single-stage linear array stops counting, any other stage of single-stage linear array except a last stage of single-stage linear array outputs an obtained current count value to a next stage of single-stage linear array, and the last stage of single-stage linear array outputs an obtained current count value.

As shown in FIG. 2, the timing control circuit 204 generates a first control signal and a second control signal, and provides the first control signal and the second control signal to each stage of the multi-stage linear array 200.

It should be noted that FIG. 2 schematically shows that an output of the single-stage linear array as the last stage is connected to the latch and the address selection circuit. As an example, the output of the last stage of single-stage linear array of the multi-stage linear array 200 is connected to a latch circuit, and the latch circuit is connected to the address selection circuit. As an example, the latch circuit latches the count value output by the last stage of single-stage linear array in response to the second control signal; the address selection circuit reads the count value latched by the latch circuit for a post-processing circuit to generate image information based on the count value.

In fact, according to a principle of the present disclosure, the timing control circuit, the latch circuit and the address selection circuit are respectively used to realize transfer timing control, cache of the counting value of the last stage of single-stage linear array and readout control of the counting value.

According to an embodiment of the present disclosure, in the pixel unit, a Single Photon Avalanche Diode (SPAD) is used to realize TDI-based imaging, that is, TDI-SPAD technology is used to realize imaging. Specifically, SPAD is an avalanche photodiode working in Geiger mode. When a single photon is incident on SPAD active region, it has a certain probability to produce a continuous avalanche breakdown. When the avalanche breakdown is quenched by a quenching circuit, it is shaped by a pulse shaping circuit and a digital pulse signal is output. Therefore, signals output by response of a series of photons incident on SPAD appear as discrete pulse signals one after another on the time axis. By counting the number of pulses using a counter, incident light intensity can be inversely deduced, thus restoring image grayscale information. When scanning with a single-stage linear array composed of multiple SPAD pixel units and counters, signals obtained by the single-stage linear array is limited in case of insufficient exposure time, so it is necessary to form a multi-stage linear array by single-stage linear arrays to improve the signal-to-noise ratio. To this end, the present disclosure proposes to use a transferable counter between various stages of single-stage linear arrays to realize a transfer accumulation function, thus improving the signal-to-noise ratio.

Figure 3:
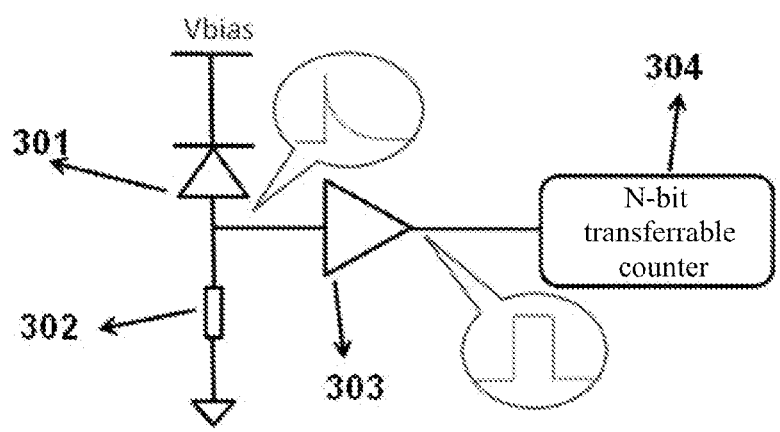
FIG. 3 is a schematic diagram of a circuit structure of a single pixel included in a time-delay-integration image sensor proposed according to a principle of the present disclosure.

Specifically, FIG. 3 shows a schematic diagram of a circuit structure of a single pixel included in a time-delay-integration image sensor proposed according to a principle of the present disclosure. As shown in FIG. 3, a pixel unit includes a Single Photon Avalanche Diode (SPAD) 301, which is connected with a corresponding quenching circuit 302 and a pulse shaping circuit 303. The single photon avalanche diode 301 is connected to a reverse bias voltage Vbias, so as to work in Geiger mode. When a single photon is incident on an active region of the single photon avalanche diode 301, it has a certain probability to produce a continuous avalanche breakdown. When the avalanche breakdown is quenched by the quenching circuit 302, it is shaped by the pulse shaping circuit 303 and a digital pulse signal is output. Therefore, signals output by response of a series of photons incident on the single photon avalanche diode 301 appear as discrete pulse signals one after another on the time axis. By counting the number of pulses using a counter, incident light intensity can be inversely deduced, thus restoring image information.

According to an example of the present disclosure, each pixel includes a pixel unit that detects photons and outputs pulse signals, where a number of the pulse signals is related to a number of the photons; and a counter that receives the pulse signals output by the pixel unit, counts the number of the pulse signals in response to the first control signal and obtains the count value, and stops counting in response to the second control signal and outputs the obtained current count value.

As an example, the pixel unit includes a Single Photon Avalanche Diode (SPAD), where the SPAD is connected to a reverse bias voltage so that the SPAD works in Geiger mode.

As an example, each pixel further includes a quenching circuit connected with the SPAD, which reduces the reverse bias voltage of the SPAD to quench avalanche and outputs a pulse signal after the SPAD receives avalanche breakdown of a single photon.

As an example, each pixel further includes a pulse shaping circuit connected to the quenching circuit, which shapes the pulse signal output by the quenching circuit and outputs a digital pulse signal to the counter.

According to the above examples of the present disclosure, the pixel unit mainly includes the single photon avalanche diode, and the pixel unit is correspondingly connected with the counter outputting digital pulse signals. In this disclosure, the counter is a transferable counter, that is, a counter with pulse counting ability and digital transfer ability, which is used to receive digital pulse signals output by corresponding pixel units and record the number of pulses, and transmit a current count value of the transferable counter at this stage to the transferable counter at a next stage under the control of specific timing.

Specifically, this disclosure proposes to use an N-bit transferable counter as a counter in each pixel to count the number of photons, and its specific structure and working principle will be described with reference to FIGS. 4 and 5.

Figure 4:
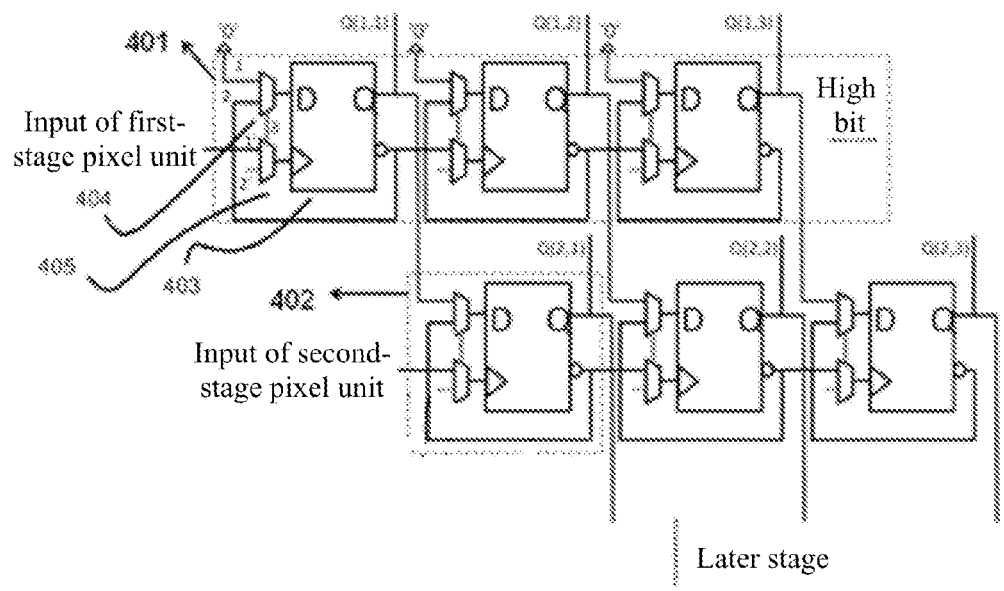
FIG. 4 is a schematic diagram of a circuit structure of a transferable counter proposed according to a principle of the present disclosure.
Figure 5:
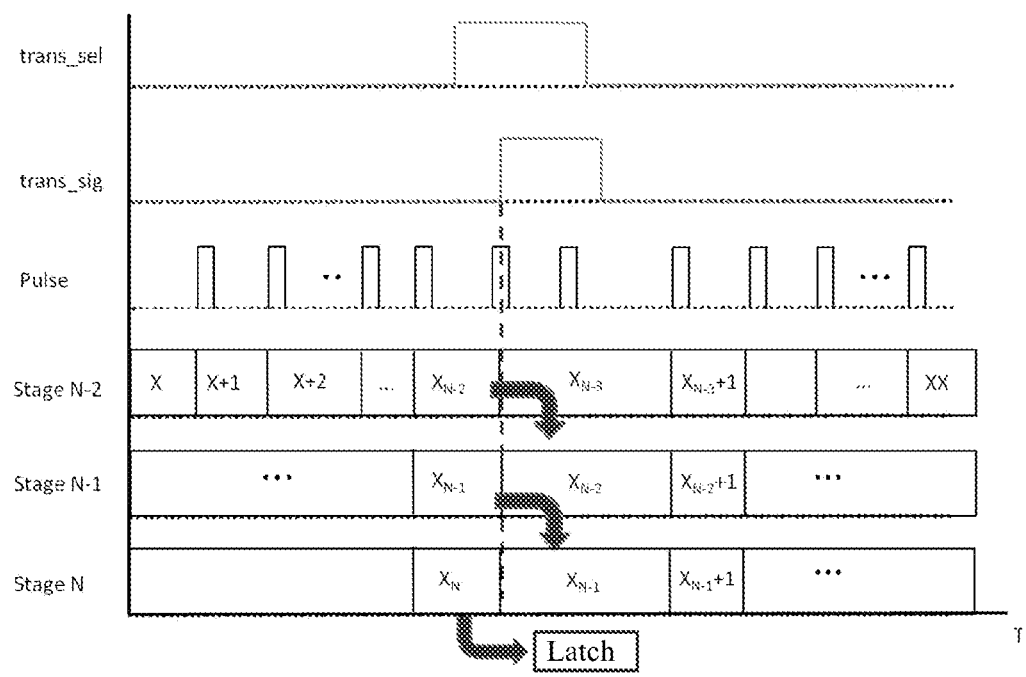
FIG. 5 is a schematic diagram of a working timing of the transferable counter proposed according to a principle of the present disclosure.

FIG. 4 shows a schematic circuit structure of a transferable counter composed of D triggers. As shown in FIG. 4, an N-bit transferable counter formed by D triggers corresponding to a certain pixel unit is shown in the horizontal direction, where from left to right is the direction of counting value from low bit to high bit, and in the vertical direction, a N-bit transferable counter corresponding to an adjacent pixel in the direction of increasing the number of stages of linear arrays is shown. Taking FIG. 4 as an example, the first row represents an N-bit transferable counter corresponding to a pixel unit of a first stage of single-stage linear array, and the second row represents an N-bit transferable counter corresponding to a pixel unit of a second stage of single-stage linear array. As an example, these two pixel units belong to two adjacent pixel units in a same row in the linear array arrangement scheme shown in FIG. 2.

Specifically, as shown in FIG. 4, for pixel units with a same position in different stages of single-stage linear arrays, an output of each stage of pixel unit is connected with a transferable counter. For example, as shown in FIG. 4, an input end of the transferable counter 401 is called the input end corresponding to a first stage of pixel unit, an input end of the transferable counter 402 is called the input end corresponding to a second stage of pixel unit, and so on. Taking the transferable counter 401 as an example, it includes multi stage of trigger units, each stage of trigger unit includes a trigger and a corresponding logic gate unit, and each stage of trigger unit corresponds to 1 bit of a count value, where a trigger unit near the input end of the counter outputs a low bit of the count value, a trigger unit far from the input end of the counter outputs a high bit of the count value, and the number of bits of the count value increases from left to right sequentially. As shown in FIG. 4, each stage of trigger unit includes one D trigger 403 and two data selectors 404 and 405 as the logic gate unit. In the circuit shown in FIG. 4, a one-out-of-two dual selector is used as an example of a data selector. Specifically, a data input end D of the D trigger 403 is connected to an output end of a first one-out-of-two dual selector 404, and a clock input end clk of the D trigger 403 is connected to an output end of a second one-out-of-two dual selector 405; a Q end of the D trigger 403 is used as a data output end to output one bit of the count value, while connected to a first input end 1 of a first one-out-of-two dual selector 404 of a trigger unit at a same position in a subsequent stage of single-stage linear array; a Qn end of the D trigger 403 is connected to a second input end 2 of the first one-out-of-two dual selector 404 of the trigger unit where it is located, while connected to a first input end 1' of a second one-out-of-two dual selector 405 of a next stage of trigger unit.

According to an example of the present disclosure, the first input ends 1 of the first one-out-of-two dual selectors 404 of the first stage of transferable counters corresponding to the pixel units in the first stage of single-stage linear array are all connected to a first level. As an example, the first level is zero level, so as to realize a zeroing operation of the counters in a transfer process.

In FIG. 4, a second input end 2' of the second one-out-of-two dual selector 405 in each stage of trigger unit receives a second control signal trans sig, which is used to trigger a transfer process of a count value between various stages of single-stage linear arrays. A gating control ends 3 of the first one-out-of-two dual selector 404 and the second one-out-of-two dual selector 405 receive a first control signal trans_sel. According to an example, when the first control signal trans_sel is "0", a counting mode of the transferable counter is triggered, and when the trans_sel signal is "1", a transfer mode of the transferable counter is triggered. Specifically, when the first control signal trans_sel is "0", a signal input at the second input end 2 of the first one-out-of-two dual selector 404 is gated to connect to the D end of the D trigger, and a signal input at the first input end 1' of the second one-out-of-two dual selector 405 is gated to connect to the clock input end clk of the D trigger, that is, two data lines in the middle among the four data lines are gated, and the transferable counter works in the normal "counting mode" at this time; when the level of the first control signal trans_sel is "1", a signal input at the first input end 1 of the first one-out-of-two dual selector 404 is gated to connect to the D end of the D trigger, and a signal input at the second input end 2' of the second one-out-of-two dual selector 405 is gated to connect to the clock input end clk of the D trigger, that is, two data lines near the outside of the four data lines are gated, and the transferable counter works in the "transfer mode" at this time.

The working principle of the transferable counter shown in FIG. 4 will be described below with reference to a working timing diagram of the transferable counter shown in FIG. 5. As shown in FIG. 5, the signal "Pulse" represents signals input by pixel units of each stage of single-stage linear array to a corresponding transferable counter. When the level of the first control signal trans_sel is "0", the transferable counter works in the "counting mode"; at this time, when the rising edge of one pulse of the signal "Pulse" reaches the input end of the first stage of trigger unit of the transferable counter, the count value of the counter will increase by 1, and Stage N−2, Stage N−1, Stage N respectively represent count values of the (N−2)th, (N−1)th and Nth stages of transferable counters. When the level of the first control signal trans_sel is "1", the transferable counter is triggered to work in the "transfer mode". As described above, the two one-out-of-two dual selectors gate the two data lines near the outside of the four data lines, that is, the signal input at the first input end 1 of the first one-out-of-two dual selector 404 is gated to connect to the D end of the D trigger, and the signal input at the second input end 2' of the second one-out-of-two dual selector 405 is gated to connect to the clock input end clk of the D trigger. At this time, when the rising edge of the second control signal trans sig comes, all D triggers will be triggered, so that their Q ends output signals input from the first input ends 1 of the first one-out-of-two dual selectors 404, thereby transferring the count value of a previous stage of counter to a next stage of counter, thus completing the global transfer of the count values; It should be specially noted that all Q ends of the first stage of transferable counter output a reset signal "0", while the value of the last stage of transferable counter is transferred to the latch. After that, the level of the first control signal trans_sel is changed to "0" again, so that the transferable counter is switched from the "transfer mode" to the "counting mode".

In addition, in FIG. 4, an implementation of the transferable counter is described by taking a D trigger as an example. For example, the basic component of the transferable counter shown in FIG. 4 include a D trigger and one-out-of-two dual selectors, but it is not limited thereto in actual circuit design. As is well known to those skilled in the art, other types of triggers can also be used to realize the transferable counter. For example, using JK trigger, SR trigger, T trigger and other triggers together with necessary logic gate circuits can also achieve the same function.

Figure 6:
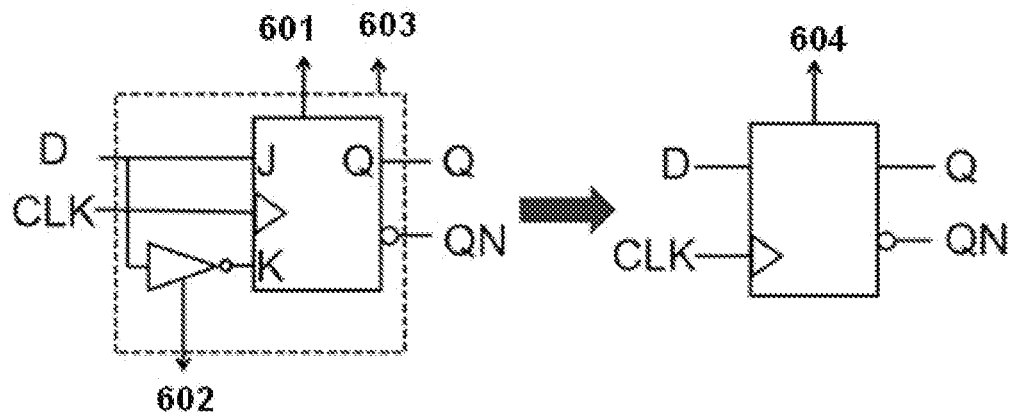
FIG. 6 is a schematic diagram of a trigger unit implemented by using a JK trigger in the transferable counter according to a principle of the present disclosure.

FIG. 6 shows a schematic diagram of converting a JK trigger into a D trigger with a necessary logic gate circuit. According to a conversion formula of two input ends J and K of JK trigger 601, J=D, K=$\overline{D}$, the J end of the JK trigger is connected to the K end of the JK trigger after level inversion via an inverter, the J end of the JK trigger serves as a data input end of the trigger, two output ends Q and QN of the JK trigger correspond to two output ends Q and QN of a D trigger, respectively, and a clock signal end CLK of the JK trigger corresponds to a clock signal end CLK of the D trigger. Therefore, the JK trigger may be converted into a D trigger with a logic gate circuit NOT gate. In addition, the circuit composed of the JK trigger and the inverter may be packaged into an integrated circuit as a D trigger circuit. The D trigger formed by using this JK trigger has the same function as an ordinary D trigger, and connection relationships between composed trigger units and transfer counter with other parts of the circuit are the same as those described in connection with FIG. 4.

Similarly, similar trigger units and corresponding transfer counter circuit may also be composed by circuits such as T trigger, SR trigger and the like, which are not repeatedly described herein.

As described above, according to a principle of the present disclosure, a counter includes a multi-stage cascaded trigger unit, where each stage of trigger unit of the multi-stage cascaded trigger unit comprises a trigger, a first data selector and a second data selector connected with the trigger, where each stage of trigger comprises: a data input end connected to an output end of the first data selector; a clock input end connected to an output end of the second data selector; a first output end for outputting counting pulses; and a second output end connected to a first input end of the first data selector; where a first input end of a second data selector in any other stage of trigger unit except a first stage of trigger unit is connected to a second output end of a trigger in a previous stage of trigger unit, a first input end of a second data selector in the first stage of trigger unit is connected to an output end of the pulse shaping circuit; a second input end of a second data selector in each stage of trigger unit receives the second control signal.

According to an example of the present disclosure, a second input end of a first data selector of a pixel in any other stage of single-stage linear array except the first stage of single-stage linear array is connected to a first output end of a trigger of a corresponding pixel in a previous stage of single-stage linear array; a second input end of a first data selector in a pixel of the first-stage of single-stage linear array receives a first level signal; a first output end of a trigger of a pixel in the last stage of single-stage linear array is connected to the latch circuit.

According to an example of the present disclosure, control ends of the first data selector and the second data selector in the trigger unit receive the first control signal.

According to an example of the present disclosure, the trigger is a D trigger.

According to an example of the present disclosure, the trigger is one of a JK trigger, an RS trigger and a T trigger, where the trigger unit further comprises a logic gate circuit connected with the trigger so as to realize function of a D trigger by using the JK trigger, the RS trigger or the T trigger.

According to a principle of the present disclosure, in addition to the arrangement scheme shown in FIG. 2 in which pixel unit linear arrays and counter linear arrays are alternately arranged in the multi-stage linear array and arranged on a same layer, the TDI image sensor may also adopt other forms of arrangement scheme of linear arrays.

Figure 7:
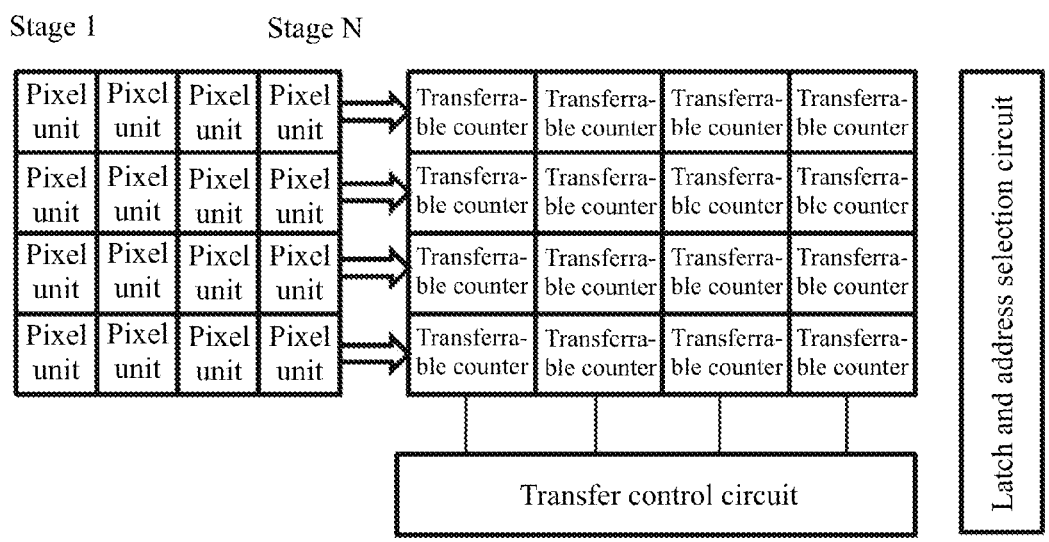
FIG. 7 is a schematic diagram of another linear array arrangement scheme of a time-delay-integration image sensor according to a principle of the present disclosure.

For example, according to another embodiment of the present disclosure, the pixel unit linear arrays and the counter linear arrays respectively form a pixel unit array and a counter array, and the pixel unit array and the counter array are arranged on a same layer, where pixel units in the pixel unit array are electrically connected with corresponding counters in the counter array. For example, as shown in FIG. 7, the pixel unit array and the counter array are designed and arranged separately in the form of two independent arrays, in which pixel units and counters are connected in one-to-one correspondence through metal wires, while related functional circuits such as the timing control circuit, the latch circuit and the address selection circuit are arranged in the periphery.

Figure 8:
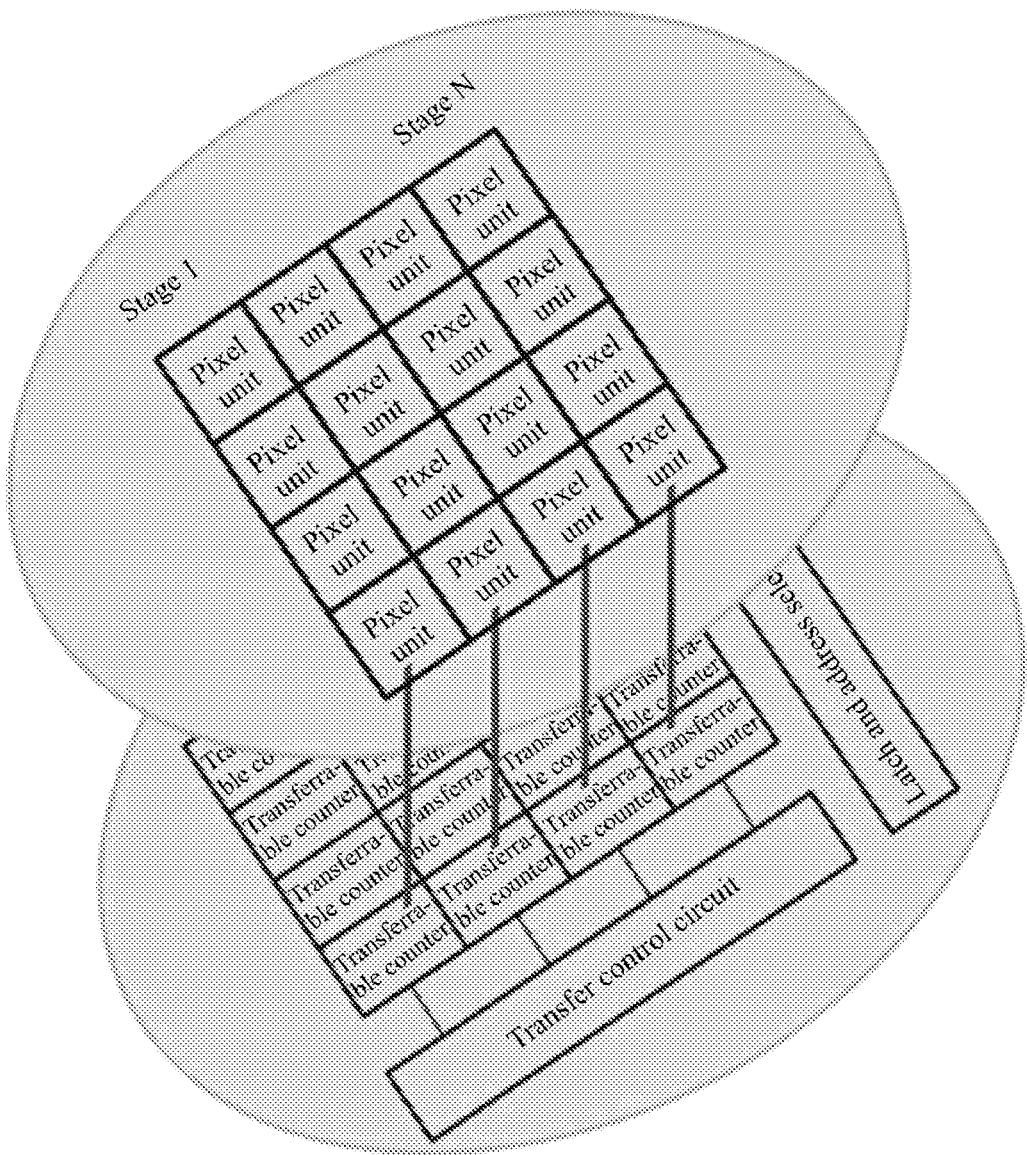
FIG. 8 is a schematic diagram of yet another linear array arrangement scheme of a time-delay-integration image sensor according to a principle of the present disclosure.

According to yet another embodiment of the present disclosure, the following arrangement scheme of linear arrays may also be adopted: pixel unit linear arrays and counter linear arrays respectively form a pixel unit array and a counter array, and the pixel unit array and the counter array are arranged on different layers. For example, the pixel unit array and the counter array are arranged on different layers based on a 3D stack process, and pixel units in the pixel unit array are electrically connected with corresponding counters in the counter array. For example, the electrical connection may be accomplished by way of Through Silicon Via (TSV). Specifically, as shown in FIG. 8, the pixel unit array, the counter array and the related functional circuits are designed in layers by adopting the 3D stack process, and two layers are electrically connected through pixel units and counters in one-to-one correspondence. As an example, the one-to-one electrical connection between pixel units and counters may be accomplished utilizing Through Silicon Via (TSV) technology.

In the arrangement of the linear arrays, the quenching circuit and/or the shaping circuit may be integrated in a pixel unit with the Single Photon Avalanche Diode (SPAD), or the quenching circuit and/or the shaping circuit may not be integrated in a pixel unit with the SPAD, and instead be placed outside the pixel unit or on different layers with the pixel unit array as required.

According to another aspect of the present disclosure, an imaging method based on Time Delay Integration (TDI) is also provided. As shown in FIG. 9, the method comprises: S910, scanning an object to be imaged by using a plurality of single-stage linear arrays arranged along a scanning direction of an image sensor, where the scanning direction of the image sensor is a stage number direction; each single-stage linear array comprises a plurality of pixels arranged along a linear array direction, and the linear array direction is perpendicular to the stage number direction; where, in response to a first control signal, each single-stage linear array is made to enter a counting mode, and in response to a second control signal, each single-stage linear array is made to enter a transfer mode, where in the counting mode, each stage of single-stage linear array is used to count optical signals incident on pixels and obtain a count value, while in the transfer mode, each stage of single-stage linear array is stopped from counting, and a current count value obtained by any other stage of single-stage linear array except a last stage of single-stage linear array is transferred to a next stage of single-stage linear array, and a current count value obtained by the last stage of single-stage linear array is output.

As an example, in this method, the optical signals are photons, and the method comprises: detecting the photons and outputting pulse signals by using a pixel unit, where a number of the pulse signals is related to a number of the photons; and receiving, by a counter, the pulse signals output by the pixel unit, counting the number of the pulse signals in response to the first control signal and obtaining the count value, and stopping counting in response to the second control signal and outputting the obtained current count value.

As an example, in this method, a Single Photon Avalanche Diode (SPAD) is used to detect the photons and output the pulse signals; where the SPAD is connected to a reverse bias voltage so that the SPAD works in Geiger mode.

As an example, the method further comprises: latching the count value output by the last stage of single-stage linear array in response to the second control signal; and reading the latched count value to generate image information based on the count value.

According to the time-delay-integration image sensor proposed in this disclosure, both the imaging process and the transfer process are purely digital processes, with low noise introduction level and little influence on MTF by the number of transfers. As shown in FIG. 10, MTF is related to transfer efficiency and the number of stages of the array. Due to charge residue in a traditional TDI-CCD transfer process, the transfer efficiency is less than 1, so MTF will decrease with the increase of the number of stages. On the contrary, the time-integration image sensor of the transferable counter adopted in this disclosure can realize the transfer efficiency $p=1$, and is not limited by the number of stages, so it has the advantages of low read-out noise, low transfer noise, less restriction of TDI stage number by MTF, low cost and the like compared with the existing TDI-CCD image sensor technology.

The embodiments described herein may be implemented in, for example, a method or process, an apparatus, a software program, a data stream or a signal. Even if only discussed in the context of a single implementation (e.g., only discussed as a method or device), implementation of the discussed features may be implemented in other forms (e.g., a program). The apparatus may be implemented with, for example, appropriate hardware, software and firmware. These methods may be implemented, for example, in an apparatus such as a processor, which generally refers to a processing device, including, for example, a computer, a microprocessor, an integrated circuit or a programmable logic device. The processor also includes a communication device, such as a computer, a mobile phone, a portable/personal digital assistant and other device that facilitates information communication between end users.

Many implementations have been described. However, it should be understood that various modifications may be made. For example, elements of different implementations may be combined, supplemented, modified or removed to produce other implementations. In addition, it can be understood by those of ordinary skill in the art that, other structures and processes may be used to replace the disclosed structures and processes, and the resulting implementations will perform at least substantially the same functions in at least substantially the same way to achieve at least substantially the same results as the disclosed implementations. Accordingly, these and other implementations are contemplated by this application.

The invention claimed is:

1. A Time Delay Integration (TDI)-based image sensor, comprising:
    a multi-stage linear array, including a plurality of single-stage linear arrays arranged along a scanning direction of the image sensor, wherein the scanning direction of the image sensor is a stage number direction, each single-stage linear array includes a plurality of pixels arranged along a linear array direction, and the linear array direction is perpendicular to the stage number direction;

wherein, each stage of single-stage linear array enters a counting mode in response to a first control signal and enters a transfer mode in response to a second control signal, wherein in the counting mode, each stage of single-stage linear array counts optical signals incident on the pixels and obtains a count value, while in the transfer mode, each stage of single-stage linear array stops counting, any other stage of single-stage linear array except a last stage of single-stage linear array outputs an obtained current count value to a next stage of single-stage linear array, and the last stage of single-stage linear array outputs an obtained current count value.

2. The image sensor of claim 1, wherein the optical signals are photons, and each pixel comprises:
a pixel unit that detects the photons and outputs pulse signals, wherein a number of the pulse signals is related to a number of the photons; and
a counter that receives the pulse signals output by the pixel unit, counts the number of the pulse signals in response to the first control signal and obtains the count value, and stops counting in response to the second control signal and outputs the obtained current count value.

3. The image sensor of claim 2, wherein,
the pixel unit includes a Single Photon Avalanche Diode (SPAD), wherein the SPAD is connected to a reverse bias voltage so that the SPAD works in Geiger mode.

4. The image sensor of claim 3, wherein each pixel further comprises:
a quenching circuit connected with the SPAD, which reduces the reverse bias voltage of the SPAD to quench avalanche and outputs a pulse signal after the SPAD receives avalanche breakdown of a single photon.

5. The image sensor of claim 4, wherein each pixel further comprises:
a pulse shaping circuit connected with the quenching circuit, which shapes the pulse signal output by the quenching circuit and outputs a digital pulse signal to the counter.

6. The image sensor of claim 1, further comprising:
a latch circuit that latches the count value output by the last stage of single-stage linear array in response to the second control signal; and
an address selection circuit that reads the count value latched by the latch circuit for a post-processing circuit to generate image information based on the count value.

7. The image sensor of claim 1, further comprising:
a timing control circuit that generates the first control signal and the second control signal and provides them to each stage of the multi-stage linear array.

8. The image sensor of any of claim 2, wherein in each single-stage linear array, pixel units and counters respectively form a pixel unit linear array and a counter linear array along the array direction.

9. The image sensor of claim 8, wherein pixel unit linear arrays and counter linear arrays are alternately arranged in the multi-stage linear array and are arranged on a same layer; or the pixel unit linear arrays and the counter linear arrays respectively form a pixel unit array and a counter array, and the pixel unit array and the counter array are arranged on a same layer, pixel units in the pixel unit array being electrically connected with corresponding counters in the counter array.

10. The image sensor of claim 8, wherein pixel unit linear arrays and counter linear arrays respectively form a pixel unit array and a counter array, and the pixel unit array and the counter array are arranged on different layers.

11. The image sensor of claim 10, wherein the pixel unit array and the counter array are arranged on different layers based on a 3D stack process, and pixel units in the pixel unit array are electrically connected with corresponding counters in the counter array.

12. The image sensor of claim 5, wherein at least one of the quenching circuit and the pulse shaping circuit is integrated in the pixel unit.

13. The image sensor of claim 6, wherein the counter comprises a multi-stage cascaded trigger unit, wherein each stage of trigger unit of the multi-stage cascaded trigger unit comprises a trigger, a first data selector and a second data selector connected with the trigger, wherein each stage of trigger comprises:
a data input end connected to an output end of the first data selector;
a clock input end connected to an output end of the second data selector;
a first output end for outputting counting pulses; and
a second output end connected to a first input end of the first data selector;
wherein, a first input end of a second data selector in any other stage of trigger unit except a first stage of trigger unit is connected to a second output end of a trigger in a previous stage of trigger unit, and a first input end of a second data selector in the first stage of trigger unit is connected to an output end of the pulse shaping circuit; a second input end of a second data selector in each stage of trigger unit receives the second control signal.

14. The image sensor of claim 13, wherein a second input end of a first data selector of a pixel in any other stage of single-stage linear array except the first stage of single-stage linear array is connected to a first output end of a corresponding trigger of a previous stage of single-stage linear array;
a second input end of a first data selector of a pixel in the first-stage of single-stage linear array receives a first level signal; and
a first output end of a trigger of a pixel in the last stage of single-stage linear array is connected to the latch circuit.

15. The image sensor of claim 13, wherein control ends of the first data selector and the second data selector in the trigger unit receive the first control signal.

16. The image sensor of claim 13, wherein the trigger is a D trigger.

17. The image sensor of claim 13, wherein the trigger is one of a JK trigger, an RS trigger and a T trigger, and the trigger unit further comprises a logic gate circuit connected with the trigger so as to realize function of a D trigger by using the JK trigger, the RS trigger or the T trigger.

18. An imaging method based on Time Delay Integration (TDI), comprising:
scanning an object to be imaged by using a plurality of single-stage linear arrays arranged along a scanning direction of an image sensor, wherein the scanning direction of the image sensor is a stage number direction; each single-stage linear array comprises a plurality of pixels arranged along a linear array direction, and the linear array direction is perpendicular to the stage number direction;

wherein, in response to a first control signal, each single-stage linear array is made to enter a counting mode, and in response to a second control signal, each single-stage linear array is made to enter a transfer mode, wherein in the counting mode, each stage of single-stage linear array is used to count optical signals incident on pixels and obtain a count value, while in the transfer mode, each stage of single-stage linear array is stopped from counting, and a current count value obtained by any other stage of single-stage linear array except a last stage of single-stage linear array is transferred to a next stage of single-stage linear array, and a current count value obtained by the last stage of single-stage linear array is output.

19. The imaging method of claim 18, wherein the optical signals are photons, and the imaging method further comprises:

detecting the photons and outputting pulse signals by using a pixel unit, wherein a number of the pulse signals is related to a number of the photons; receiving, by a counter, the pulse signals output by the pixel unit, counting the number of the pulse signals in response to the first control signal and obtaining the count value, and stopping counting in response to the second control signal and outputting the obtained current count value; and detecting the photons and outputting the pulse signals by using a Single Photon Avalanche Diode (SPAD); wherein the SPAD is connected to a reverse bias voltage so that the SPAD works in Geiger mode.

20. The imaging method of claim 18, further comprising:

latching the count value output by the last stage of single-stage linear array in response to the second control signal; and reading the latched count value to generate image information based on the count value.

* * * * *